United States Patent
No (10) Patent No.: US 7,710,806 B2
(45) Date of Patent: May 4, 2010

(54) MEMORY DEVICE AND METHOD FOR IMPROVING SPEED AT WHICH DATA IS READ FROM NON-VOLATILE MEMORY

(75) Inventor: Seung-Hyo No, Hwaseong-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 11/440,732

(22) Filed: May 25, 2006

(65) Prior Publication Data
US 2007/0019484 A1    Jan. 25, 2007

(30) Foreign Application Priority Data
Jul. 23, 2005    (KR)    ............ 10-2005-0067060

(51) Int. Cl.
*G11C 7/02*    (2006.01)
(52) U.S. Cl. ............ 365/208; 365/185.29; 365/185.25
(58) Field of Classification Search ............ 365/185.25, 365/185.29, 208
See application file for complete search history.

(56) References Cited

U.S. PATENT DOCUMENTS

| | | | |
|---|---|---|---|
| 4,847,811 A | 7/1989 | Gastaldi et al. | |
| 6,134,146 A | 10/2000 | Bill et al. | |
| 6,762,970 B2 | 7/2004 | Joo | |
| 7,154,797 B1 * | 12/2006 | Saito et al. | 365/208 |
| 2004/0100835 A1 * | 5/2004 | Sugibayashi et al. | 365/200 |
| 2005/0018489 A1 * | 1/2005 | Hosono | 365/185.29 |

FOREIGN PATENT DOCUMENTS

| | | |
|---|---|---|
| JP | 2003-203491 | 7/2003 |
| KR | 1020000044910 | 7/2000 |
| KR | 1020030052483 A | 6/2003 |

OTHER PUBLICATIONS

Office Action dated Jul. 6, 2009 in corresponding German Application No. 10 2006 033 385.3-55.

* cited by examiner

*Primary Examiner*—Hoai V Ho
*Assistant Examiner*—Jason Lappas
(74) *Attorney, Agent, or Firm*—F. Chau & Associates, LLC (57) ABSTRACT

A memory device and method for improving speed at which data is read from non-volatile memory are provided, where the memory device including the non-volatile memory precharges all word lines with a predetermined precharge voltage during standby for a read operation, in which data is read from the non-volatile memory, and then, during the read operation, pulls up a voltage of only a word line selected by a row address to a read voltage and pulls down a voltage of remaining unselected word lines down to a ground voltage, such that data reading speed of the memory device is increased.

18 Claims, 6 Drawing Sheets

MEMORY DEVICE AND METHOD FOR IMPROVING SPEED AT WHICH DATA IS READ FROM NON-VOLATILE MEMORY

CROSS-REFERENCE TO RELATED APPLICATION

This application claims foreign priority under 35 U.S.C. §119 to Korean Patent Application No. 10-2005-0067060, filed on Jul. 23, 2005, in the Korean Intellectual Property Office, the disclosure of which is incorporated by reference herein in its entirety.

BACKGROUND OF THE INVENTION

1. Field of the Invention

The present disclosure relates to a memory device, and more particularly, to a memory device and method for improving a speed at which data is read from non-volatile memory.

2. Description of the Related Art

Electrically erasable programmable read-only memory (EEPROM) is widely used as a non-volatile data storage device such as a smart card or an integrated circuit card.

Figure 1:
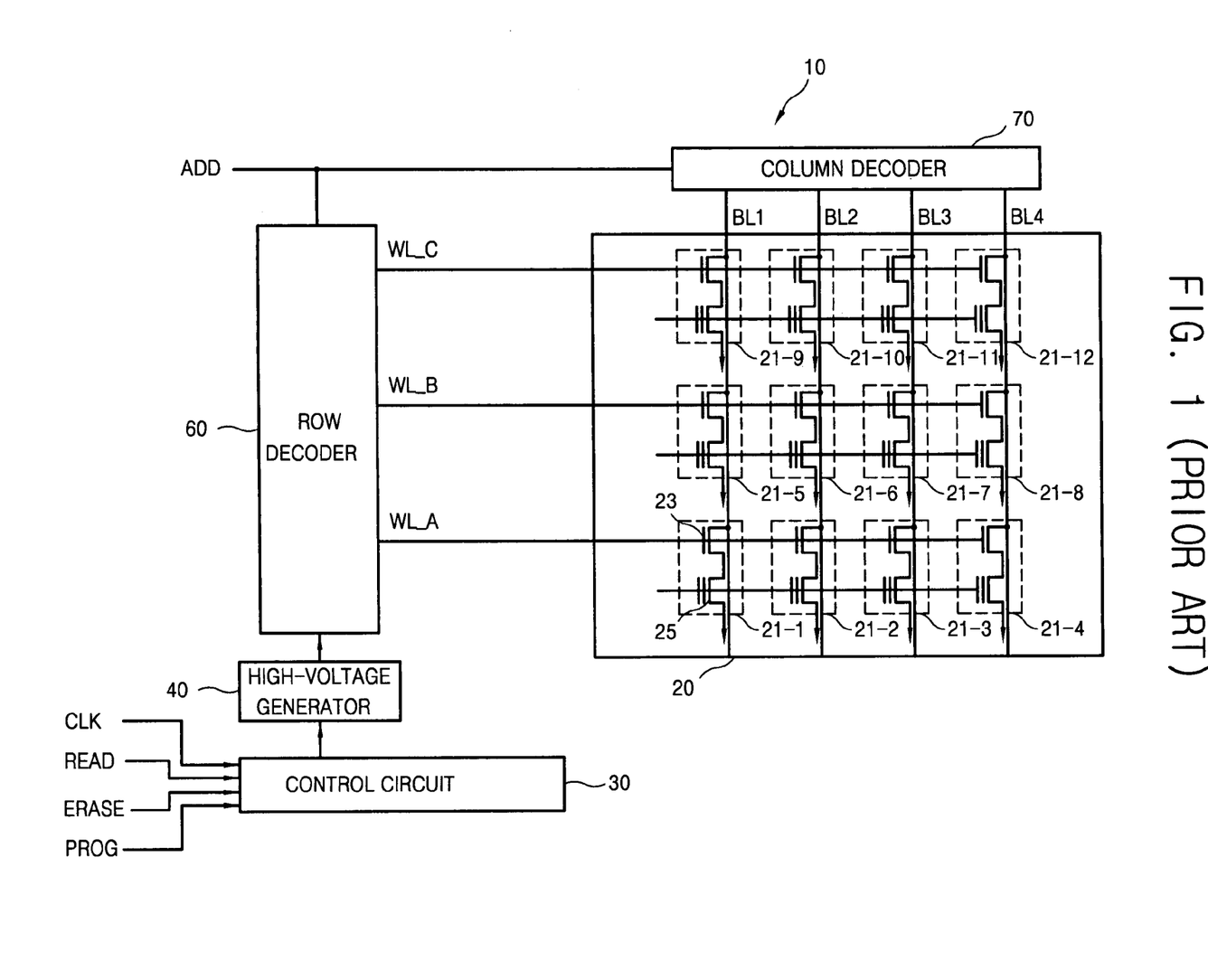
FIG. 1 is a block diagram of a conventional memory device.

FIG. 1 is a block diagram of a conventional memory device 10. Referring to FIG. 1, the memory device 10 includes a memory cell array 20, a control circuit 30, a high-voltage generator 40, a row decoder 60, and a column decoder 70.

The memory cell array 20 includes a plurality of non-volatile memory cells 21-1 through 21-12 connected between word lines WL_A, WL_B, and WL_C and bit lines BL1, BL2, BL3, and BL4. As is well known to those of ordinary skill in the pertinent art, each of the plurality of non-volatile memory cells 21-1 through 21-12 includes a selection transistor 23 and an EEPROM cell 25.

The control circuit 30 controls the operation of the high-voltage generator 40 in response to a clock signal CLK, a read control signal READ, an erase control signal ERASE, and a program control signal PROG, which are received from a memory controller (not shown).

The high-voltage generator 40 is controlled by the control circuit 30 to generate a predetermined high voltage needed to program or erase data to or from each of the non-volatile memory cells 21-1 through 21-12 and a predetermined high voltage needed to read data from each of the non-volatile memory cells 21-1 through 21-12.

The row decoder 60 enables a high voltage generated by the high-voltage generator 40 to one among the word lines WL_A, WL_B, and WL_C in response to an address ADD. The column decoder 70 selects one among the bit lines BL1, BL2, BL3, and BL4 in response to the address ADD.

Figure 2:
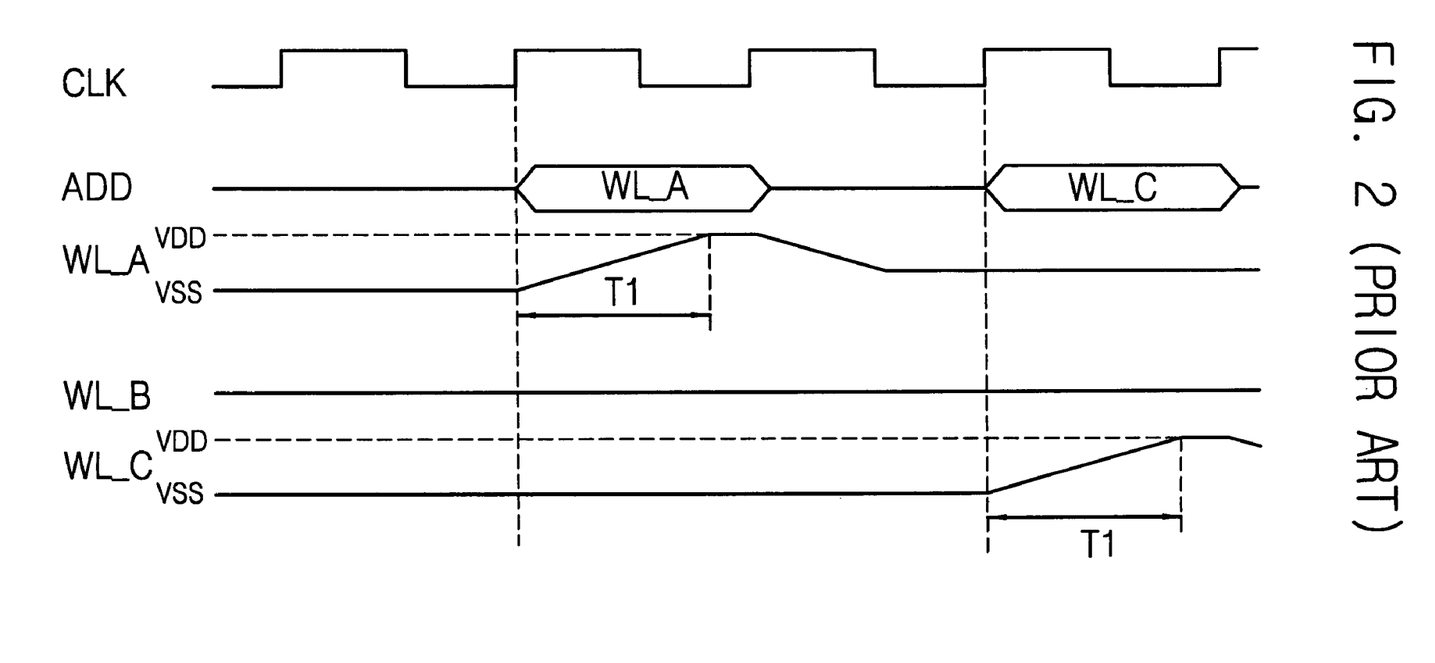
FIG. 2 is a timing diagram of a read operation of the memory device illustrated in FIG. 1.

FIG. 2 is a timing diagram of a read operation of the memory device 10 illustrated in FIG. 1. Referring to FIGS. 1 and 2, in a data read operation, the word line WL_A or WL_C is selected in response to the address ADD, a voltage of the selected word line WL_A or WL_C increases from a ground voltage (VSS) to a read voltage or a power supply voltage (VDD). Accordingly, data stored in EEPROM cells 21-1 through 21-4 or 21-9 through 21-12 corresponding to the word line WL_A or WL_C are transmitted to the corresponding bit lines BL1 through BL4, respectively.

Since the plurality of EEPROM cells 21-1 through 21-4 or 21-9 through 21-12 are connected to the selected word line WL_A or WL_C and parasitic capacitance is present in the selected word line WL_A or WL_C, it takes a long time T1 to increase the voltage from the ground voltage VSS to the power supply voltage VDD. As a result, it takes the long time T1 to read data from the EEPROM cells 21-1 through 21-4 or 21-9 through 21-12 of the selected word line WL_A or WL_C.

SUMMARY OF THE INVENTION

The present disclosure provides a memory device and method for improving a speed at which data is read from non-volatile memory without increasing voltage or voltage driving ability of a word line.

According to an aspect of the present disclosure, there is provided a memory device including non-volatile memory. The memory device precharges all word lines with a predetermined precharge voltage during standby for a read operation, in which data is read from the non-volatile memory, and then, during the read operation, pulls up a voltage of only a word line selected by a row address to a read voltage and pulls down a voltage of remaining unselected word lines down to a ground voltage.

According to another aspect of the present disclosure, there is provided a memory device including a plurality of non-volatile memory cells connected between a plurality of word lines and a plurality of bit lines, respectively; a row decoder comprising a plurality of output terminals connected to the plurality of word lines, respectively; a voltage generator generating a precharge voltage; and a switching block supplying the precharge voltage to at least one among the plurality of word lines in response to a control signal.

According to still another aspect of the present disclosure, there is provided a memory device including a plurality of non-volatile memory cells connected between a plurality of word lines and a plurality of bit lines, respectively, at least one switching circuit switching in response to a control signal, and a row decoder supplying a read voltage to a word line selected among the plurality of word lines in response to a row address, wherein the at least one switching circuit supplies a precharge voltage to at least one word line among the plurality of word lines in response to the control signal.

According to yet another aspect of the present disclosure, there is provided a memory device including a plurality of non-volatile memory cells connected between a plurality of word lines and a plurality of bit lines, a plurality of switching circuits each connected to at least one word line to switch in response to a control signal, and a plurality of row decoders connected to the plurality of word lines, respectively, wherein each of the plurality of switching circuits precharges the corresponding at least one word line with a precharge voltage in response to the control signal, and each of the plurality of row decoders supplies a read voltage to a word line selected among the plurality of word lines in response to a row address corresponding to the word line.

The precharge voltage may be equal to the read voltage or half of the read voltage. Each of the plurality of switching circuits may be a transmission gate that switches in response to the control signal.

According to a further aspect of the present disclosure, there is provided a memory device including a plurality of non-volatile memory cells connected between a plurality of word lines and a plurality of bit lines; a row decoder comprising a plurality of output terminals connected to the plurality of word lines, respectively; and a voltage generator generating a precharge voltage and a read voltage, wherein the row decoder precharges the plurality of word lines with the precharge voltage during standby for a read operation and drives the read voltage to a word line selected by a row address and drives a ground voltage to unselected word lines during the read operation.

According to another aspect of the present disclosure, there is provided a method of driving a word line to read data. The method includes precharging at least one word line among a plurality of word lines in response to a control signal before a data read operation, driving a read voltage to the selected word line in response to a row address, and driving a ground voltage to remaining unselected word lines during the data read operation.

BRIEF DESCRIPTION OF THE DRAWINGS

The above and other features and advantages of the present disclosure will become more apparent by describing in detail exemplary embodiments thereof with reference to the attached drawings, in which.

DETAILED DESCRIPTION OF PREFERRED EMBODIMENTS

The attached drawings for illustrating preferred embodiments of the present disclosure are referred to in order to gain a sufficient understanding of the present disclosure, the merits thereof, and the advantages attained by the implementation of embodiments of the present disclosure.

Hereinafter, the present disclosure will be described in detail by explaining preferred embodiments with reference to the attached drawings. Like reference numerals in the drawings may denote like elements.

Figure 3:
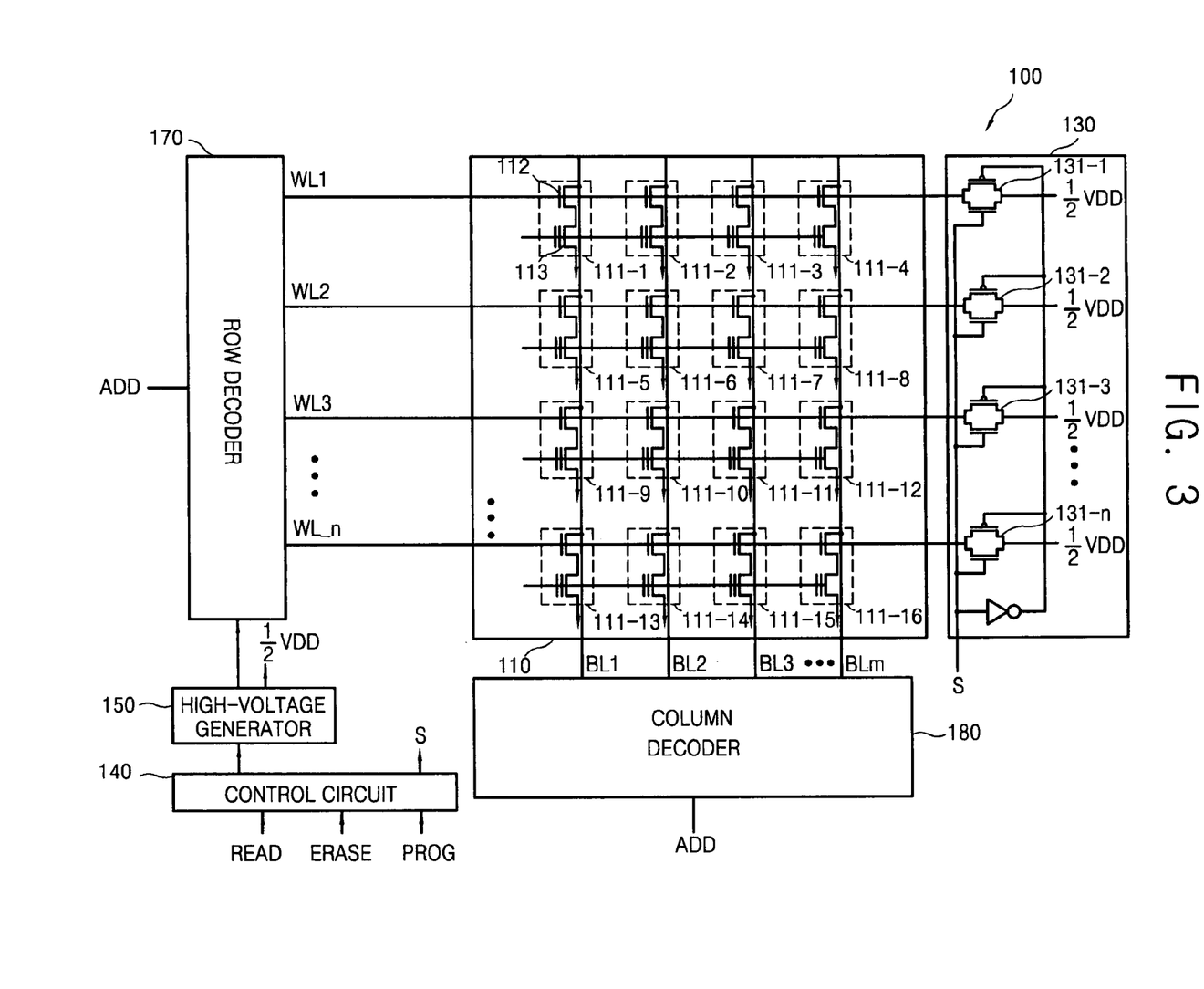
FIG. 3 is a block diagram of a memory device according to an embodiment of the present disclosure.

FIG. 3 is a block diagram of a memory device 100 according to an embodiment of the present disclosure. Referring to FIG. 3, the memory device or semiconductor chip 100 includes a memory cell array 110, a switching block 130, a control circuit 140, a high-voltage generator 150, a row decoder 170, and a column decoder 180.

The memory cell array 110 includes a plurality of non-volatile memory cells 111-1 through 111-16 connected between word lines WL1, WL2, WL3, ..., and WLn (where "n" is a natural number) and bit lines BL1, BL2, BL3, ..., and BLm (where "m" is a natural number). Each of the plurality of non-volatile memory cells 111-1 through 111-16 includes an EEPROM cell 112 and a selection transistor 113.

The switching block 130 includes a plurality of switching circuits 131-1, 131-2, 131-3, ..., and 131-n. During standby for a read operation, the switching circuits 131-1, 131-2, 131-3, ..., and 131-n supply a precharge voltage (e.g., 0.5 VDD) to the corresponding word lines WL1, WL2, WL3, ..., and WLn, respectively, in response to a control signal S. The switching circuits 131-1, 131-2, 131-3, ..., and 131-n supply the precharge voltage to the word lines WL1, WL2, WL3, ..., and WLn in one-to-one correspondence, but the present invention is not restricted thereto. For example, one switching circuit 131-1 may simultaneously drive a plurality of word lines WL1 through WL3. Each of the switching circuits 131-1, 131-2, 131-3, ..., and 131-n is implemented as a transmission gate including a PMOS transistor and an NMOS transistor.

The control circuit 140 controls the operation of the high-voltage generator 150 in response to a clock signal CLK, a read control signal READ, an erase control signal ERASE, and a program control signal PROG, which are received from a memory controller. In addition, the control circuit 140 generates the control signal S to control the operation of the switching block 130 in response to the read control signal READ.

The high-voltage generator 150 is controlled by the control circuit 140 to generate a predetermined high voltage needed to program or erase data to or from each of the non-volatile memory cells 111-1 through 111-16, a predetermined high voltage needed to read data from each of the non-volatile memory cells 111-1 through 111-16, and a voltage (e.g., a read voltage of 0.5 VDD) supplied to the switching block 130.

The high-voltage generator 150 shown in FIG. 3 generates the voltage such as 0.5 VDD supplied to the switching block 130 in addition to the predetermined high voltages, but the present invention is not restricted thereto. The voltage such as 0.5 VDD supplied to the switching block 130 may be generated by a separate voltage generator.

The row decoder 170 enables the high voltage generated by the high-voltage generator 150 to one word line among the word lines WL1 through WLn in response to an address ADD. For example, during the read operation, the row decoder 170 drives one word line that is selected among the word lines WL1 through WLn by the address ADD with a read voltage (VDD). The column decoder 180 selects one among the bit lines BL1 through BLm in response to the address signal ADD.

Figure 4:
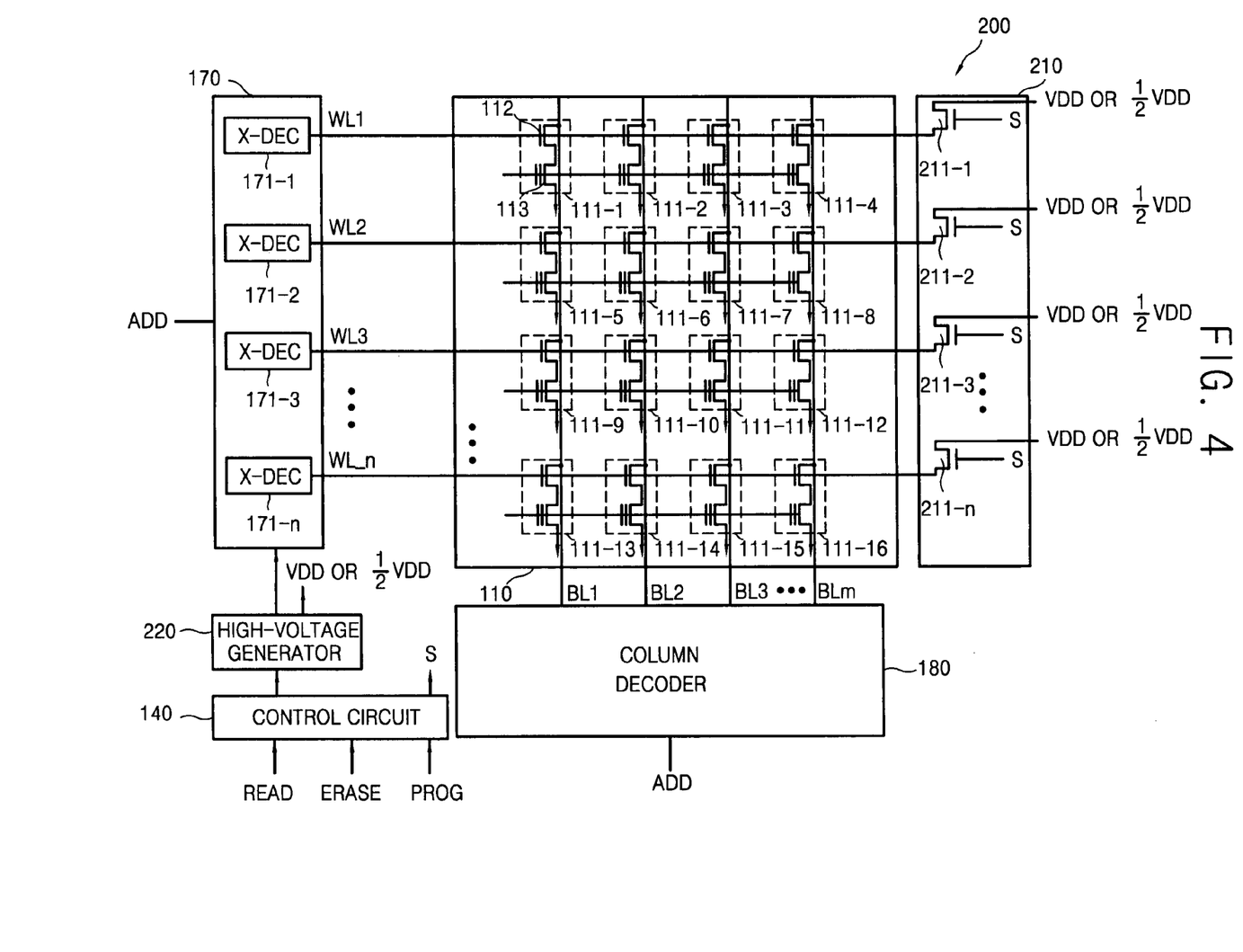
FIG. 4 is a block diagram of a memory device according to another embodiment of the present disclosure.

FIG. 4 is a block diagram of a memory device 200 according to another embodiment of the present disclosure. The memory device 200 shown in FIG. 4 has about the same structure as memory device 100 shown in FIG. 3, with the exception of a switching block 210 and a high-voltage generator 220.

The row decoder 170 includes a plurality of unit row decoders 171-1 through 171-n. The unit row decoders 171-1 through 171-n apply a read voltage generated by the high-voltage generator 220 to the corresponding word lines WL1 through WLn, respectively.

The switching block 210 includes a plurality of switching circuits 211-1 through 211-n which precharge the corresponding word lines WL1 through WLn, respectively, with a precharge voltage (e.g., VDD or 0.5 VDD) in response to the control signal S. Alternatively, a single switching circuit included in the switching block 210 may simultaneously precharge a plurality of word lines with the precharge voltage such as VDD or 0.5 VDD.

The high-voltage generator 220 is controlled by the control circuit 140 to generate a high voltage needed for a program operation, a high voltage needed for an erase operation, a high voltage (e.g., VDD) needed for a data read operation, and a precharge voltage (e.g., VDD or ½ VDD) used to precharge at least one word line among the word lines WL1 through WLn during standby for the data read operation.

Figure 5:
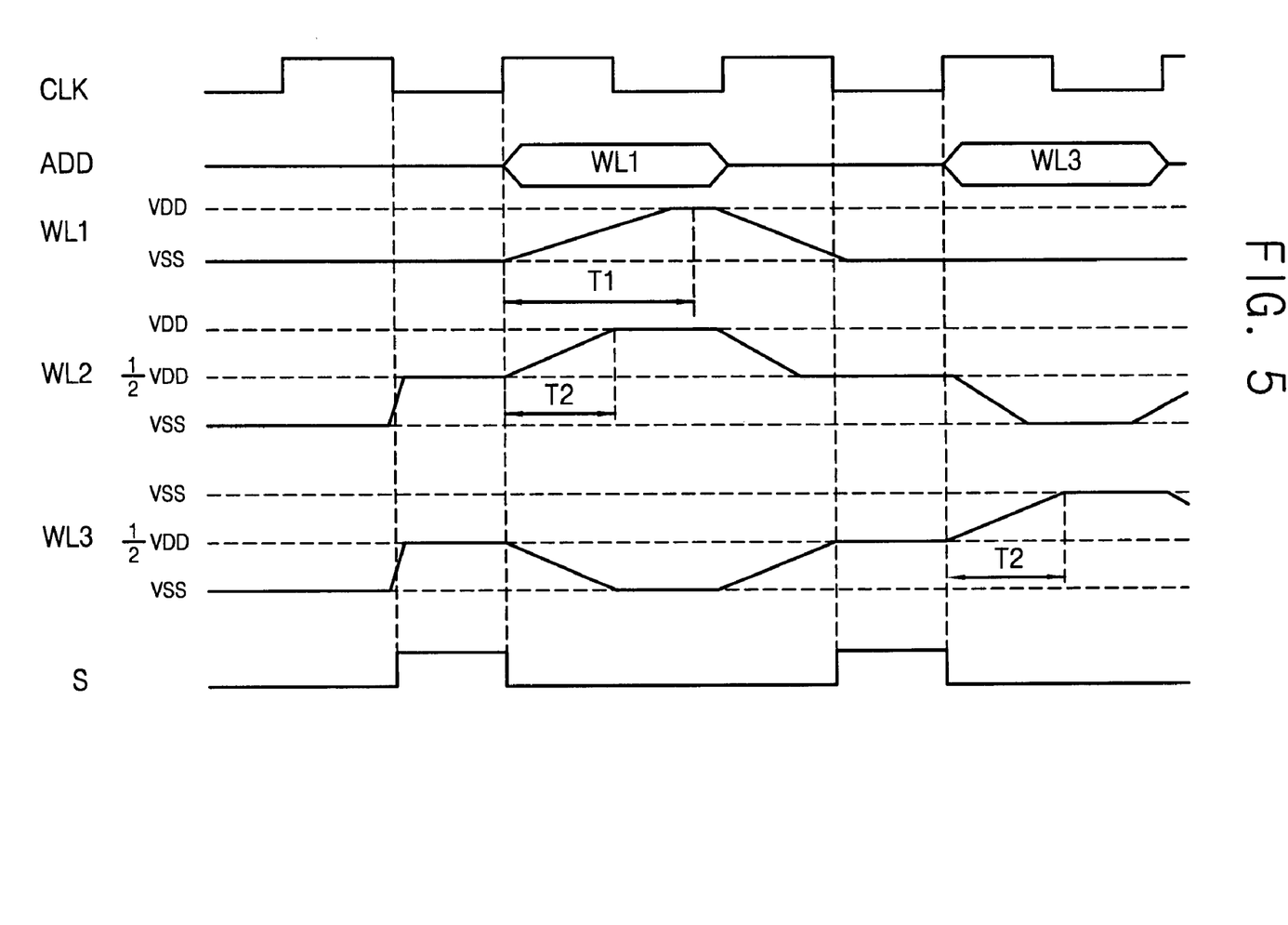
FIG. 5 is a timing diagram of a read operation of the memory devices illustrated in FIGS. 3 and 4.

FIG. 5 is a timing diagram of a read operation of the memory devices illustrated in FIGS. 3 and 4. The read operation of a memory device of the present disclosure will be described with reference to FIGS. 3 through 5 below.

The control circuit 140 enables the control signal S, i.e., a word line precharge control signal in response to the read control signal READ. The high-voltage generator 150 is controlled by the control circuit 140 to generate a read voltage (e.g., VDD) needed for the read operation and a precharge voltage (e.g., 0.5 VDD) needed to precharge at least one among the word lines WL1 through WLn.

The switching circuits 131-1 through 131-n in the switching block 130 precharge the word lines WL1 through WLn, respectively, with the precharge voltage such as 0.5 or ½ VDD in response to the control signal S.

The row decoder 170 supplies the read voltage VDD generated by the high-voltage generator 150 to the word line WL1 in response to the address ADD for selecting the word line WL1. Then, a voltage of the word line WL1 increases from the precharge voltage of 0.5 VDD to the read voltage VDD, and a voltage of the remaining word lines WL2 through WLn decreases from the precharge voltage of 0.5 VDD to a ground voltage (VSS).

In addition, when the row decoder 170 supplies the read voltage VDD to the word line WL3 in response to the address ADD for selecting the word line WL3, a voltage of the word line WL3 increases from the precharge voltage of 0.5 VDD to the read voltage VDD and a voltage of the remaining word lines WL1, WL2, and WL4 through WLn decreases from the precharge voltage of 0.5 VDD to the ground voltage VSS.

Since the memory devices 100 and 200 according to embodiments of the present disclosure precharge all of the word lines WL1 through WLn with the precharge voltage, such as the read voltage or half of the read voltage, during the standby for the data read operation, a time T2 taken to increase the precharge voltage to the read voltage in the data read operation according to an embodiment of the present disclosure is theoretically reduced by half as compared to the time T1 taken to increase the ground voltage VSS to the read voltage VDD in conventional technology. Accordingly, a data reading speed of the memory device 100 or 200 according to an embodiment of the present disclosure is much faster than that of the conventional memory device 10.

Figure 6:
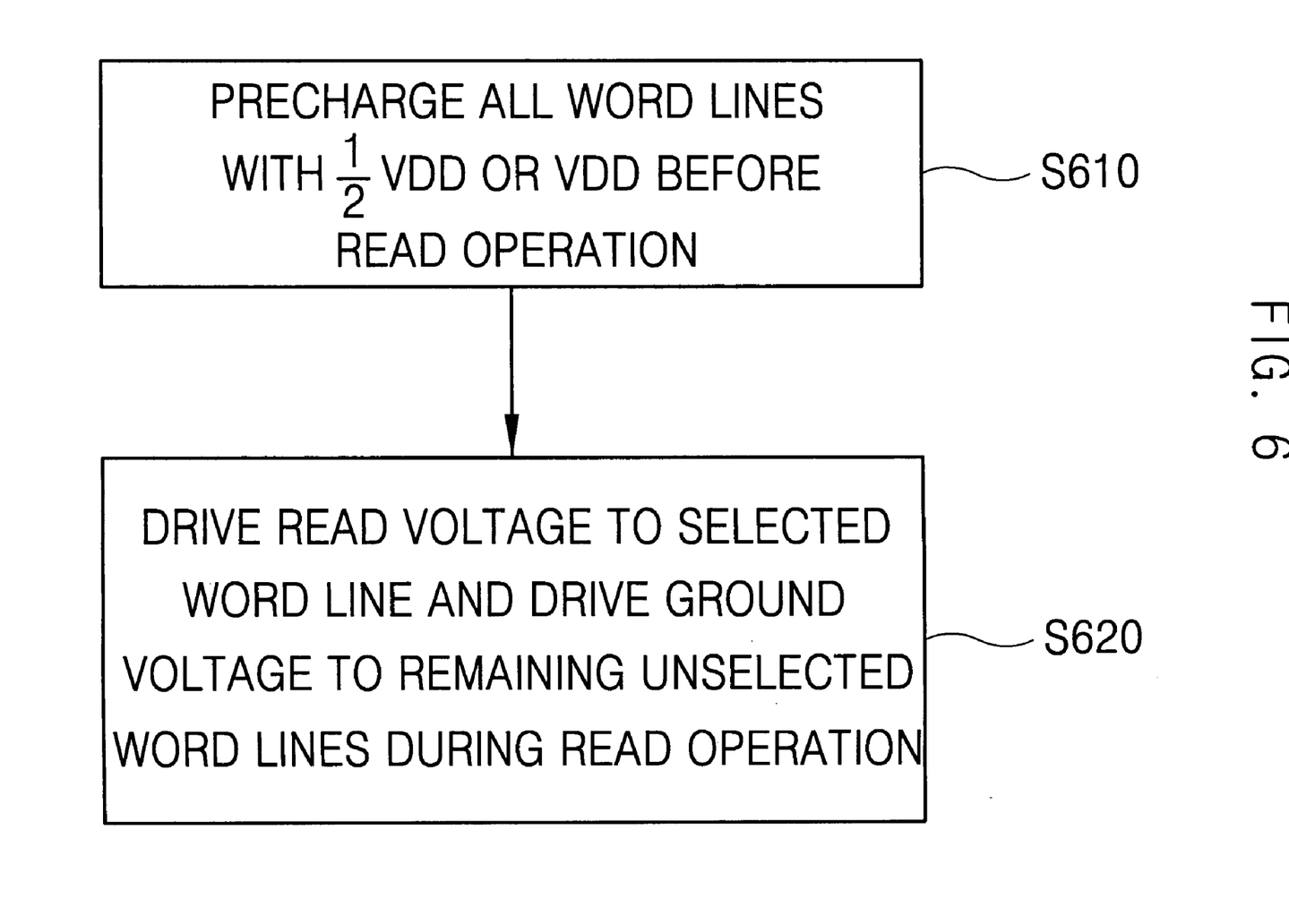
FIG. 6 is a flowchart of a method of driving a word line to read data, according to an embodiment of the present disclosure.

FIG. 6 is a flowchart of a method of driving a word line to read data, according to an embodiment of the present disclosure. Referring to FIGS. 3 through 6, in operation S610, the memory device 100 or 200 precharges all of the word lines WL1 through WLn with the precharge voltage (e.g., VDD or ½ VDD), before a read operation or during standby for the read operation, in a procedure of performing the read operation.

In operation S620, the row decoder 170 or 230 enables the read voltage (VDD) to a word line selected by the address ADD and enables the ground voltage (VSS) to all of unselected word lines. In another embodiment, the row decoder 170 may precharge all of the word lines WL1 through WLn with the precharge voltage (e.g., VDD or ½ VDD) during the standby for the read operation and then may enable the read voltage (VDD) to a word line selected by the address signal ADD and enable the ground voltage (VSS) to all of unselected word lines. As described above, according to the present disclosure, a speed at which data is read from nonvolatile memory is improved without increasing the performance of word lines enabling a voltage.

While the present invention has been particularly shown and described with reference to exemplary embodiments thereof, it will be understood by those of ordinary skill in the pertinent art that various changes in form and details may be made therein without departing from the spirit and scope of the present invention as defined by the following claims.

What is claimed is:

1. A switching circuit connected to the voltage generator and configured to directly supply during standby for a data read operation the precharge voltage to at least one among the plurality of combined read/write word lines selected for the data read operation, in response to a word line precharge control signal, wherein the precharge voltage is equal to a voltage in the range form about one half of a read voltage to about the read voltage, in combination with other limitations.

2. The memory device of claim 1, further comprising:
a control circuit configured to generate the word line precharge control signal in response to a read control signal.

3. The memory device of claim 1, wherein the row decoder enables a read voltage higher than the precharge voltage to the at least one among the plurality of word lines during a read operation after the plurality of word lines are charged with the precharge voltage.

4. The memory device of claim 1, wherein the switching circuit comprises a plurality of transmission gates, each of the plurality of transmission gate connects an output terminal of the voltage generator to at least one among the plurality of word lines in response to the control signal.

5. The memory device of claim 1, wherein the switching circuit comprises a plurality of switching transistors that connect an output terminal of the voltage generator to at least one among the plurality of word lines, respectively, and each comprises a gate receiving the control signal.

6. The memory device of claim 1, wherein:
the row decoder supplies a read voltage to at least one word line selected among the plurality of word lines in response to a row address; and
the switching circuit is at least one switching circuit that switches in response to the control signal and supplies the precharge voltage to the at least one word line in response to the control signal.

7. The memory device of claim 6, wherein the precharge voltage is equal to the read voltage or half of the read voltage.

8. The memory device of claim 6, wherein the at least one switching circuit is a transistor that supplies the precharge voltage to at least one among the plurality of word lines in response to the control signal input to a gate.

9. The memory device of claim 6, wherein the at least one switching circuit is a transmission gate that switches in response to the control signal.

10. The memory device of claim 6, wherein the at least one switching circuit supplies the precharge voltage to at least one word line among the plurality of word lines during standby for a read operation, and the row decoder supplies the read voltage to the word line selected in response to the row address among the plurality of word lines during the read operation.

11. The memory device of claim 1, wherein:
the row decoder is one of a plurality of row decoders connected to the plurality of word lines, respectively, and each of the plurality of row decoders supplies a read voltage to a word line selected in response to a corresponding row address among the plurality of word lines; and
the switching circuit is one of a plurality of switching circuits each connected to at least one word line to switch in response to the control signal, and each of the plurality of switching circuits precharges the corresponding at least one word line with the precharge voltage in response to the control signal.

12. The memory device of claim 11, wherein the precharge voltage is equal to the read voltage or half of the read voltage.

13. The memory device of claim 11, wherein each of the plurality of switching circuits is a transmission gate that switches in response to the control signal.

14. The memory device of claim 11, further comprising a precharge voltage generator generating the precharge voltage, wherein each of the plurality of switching circuits is connected between an output terminal of the precharge voltage generator and a corresponding at least one word line among the plurality of word lines and comprises a gate receiving the control signal.

15. The memory device of claim 1, wherein:

the voltage generator generates the precharge voltage and a read voltage; and the row decoder has a plurality of output terminals connected to the plurality of word lines, respectively, and the row decoder precharges the plurality of word lines with the precharge voltage during standby for a read operation and drives the read voltage to a word line selected by a row address and drives a ground voltage to unselected word lines during the read operation.

16. The memory device of claim 15, wherein the precharge voltage is half of the read voltage.

17. Switching means connected to the voltage generating means and configured to directly supply during standby for a data read operation the precharge voltage to at least one among the plurality of combined read/write word lines selected for the data read operation, in response to a word line precharge control signal, wherein the precharge voltage is equal to a voltage in the range from about one half of a read voltage to about the read voltage, in combination with other limitations.

18. The memory device of claim 1 wherein each of the plurality of word lines is an elongated read/write word line, the row decoder is connected to one end of each of the plurality of elongated word lines, and at least one of the voltage generator or the switching circuit is connected to an opposite end of each of the plurality of elongated word lines.

* * * * *